(12) United States Patent
Hill

(10) Patent No.: US 7,495,770 B2
(45) Date of Patent: Feb. 24, 2009

(54) BEAM SHEAR REDUCTION IN INTERFEROMETRY SYSTEMS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 90 days.

(21) Appl. No.: 11/500,562

(22) Filed: Aug. 8, 2006

(65) Prior Publication Data

US 2007/0035742 A1    Feb. 15, 2007

Related U.S. Application Data

(60) Provisional application No. 60/706,529, filed on Aug. 9, 2005.

(51) Int. Cl.
*G01B 11/02* (2006.01)

(52) U.S. Cl. .................. 356/498; 356/520; 356/487

(58) Field of Classification Search ................ 356/498, 356/67, 71, 359, 453, 520, 491–495, 487
See application file for complete search history.

(56) References Cited

U.S. PATENT DOCUMENTS

| | | | |
|---|---|---|---|
| 6,137,574 A | 10/2000 | Hill | |
| 6,219,144 B1 | 4/2001 | Hill et al. | |
| 6,246,481 B1 | 6/2001 | Hill | |
| 6,252,688 B1 | 6/2001 | Ishikawa et al. | |
| 6,313,918 B1 * | 11/2001 | Hill et al. | 356/498 |
| 6,327,039 B1 | 12/2001 | De Groot et al. | |
| 7,023,561 B2 * | 4/2006 | Kakuchi et al. | 356/512 |
| 2003/0043384 A1 | 3/2003 | Hill | |
| 2003/0053073 A1 | 3/2003 | Hill | |
| 2003/0169429 A1 | 9/2003 | Hill | |
| 2003/0211402 A1 * | 11/2003 | Hill | 430/5 |
| 2003/0220057 A1 | 11/2003 | Lin | |

OTHER PUBLICATIONS

U.S. Appl. No. 11/472,668, Hill, filed Jun. 22, 2006.
U.S. Appl. No. 60/314,345, Hill, filed Aug. 23, 2001.
J.P. Monchalin et al., "Accurate Laser Wavelength Measurement With A Precision Two-Beam Scanning Michelson Interferometer", Applied Optics, 20(5), 736-757 (1981).
C. Zanoni, "Differential interferometer arrangements for distance and angle measurements: Principles, advantages and applications", VDI Berichte Nr. 749, 93-106 (1989).

* cited by examiner

*Primary Examiner*—Tarifur Chowdhury
*Assistant Examiner*—Michael LaPage
(74) *Attorney, Agent, or Firm*—Fish & Richardson P.C.

(57) ABSTRACT

In certain aspects, the invention features interferometry systems that include an input assembly positioned to receive a beam emitted from a light source comprising a first component beam and a second component beam, the input assembly being configured to change a dimension of one of the component beams relative to the dimension of the other component beam, an interferometer positioned to receive the component beams propagating from the input assembly, the interferometer being configured to direct the component beams along different paths and to produce an output beam by directing the component beams along a common path, wherein the output beam comprises information about an optical path difference between the different component beam paths, and an output assembly positioned in the path of the output beam and configured to change a dimension of the component beam that contacts the measurement object.

24 Claims, 8 Drawing Sheets

BEAM SHEAR REDUCTION IN INTERFEROMETRY SYSTEMS

CROSS-REFERENCE TO RELATED APPLICATIONS

This application claims priority to U.S. Provisional Patent No. 60/706,529, entitled "BEAM SHEAR REDUCTION IN INTERFEROMETRY SYSTEMS," filed on Aug. 9, 2005, the entire contents of which are hereby incorporated by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

Generally, the measurement and reference beams are derived from a common source. Typically, the source delivers an input beam to the interferometer, which splits the input beam into the measurement and reference beams. In some embodiments, optical waveguides are used to deliver the input beam from the light source to the interferometer.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarization beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where $v$ is the relative speed of the measurement and reference objects, $\lambda$ is the wavelength of the measurement and reference beams, $n$ is the refractive index of the medium through which the light beams travel, e.g., air or vacuum, and $p$ is the number of passes to the reference and measurement objects. Changes in the phase of the measured interference signal correspond to changes in the relative position of the measurement object, e.g., a change in phase of $2\pi$ corresponds substantially to a distance change L of $\lambda/2np$. Distance 2L is a round-trip distance change or the change in distance to and from a stage that includes the measurement object. In other words, the phase $\Phi$, ideally, is directly proportional to L, and can be expressed as $$\Phi = 2pkL\cos^2\theta \qquad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Equation (1) can be approximated by $$\Phi = 2pkL(1-\theta^2) \qquad (2)$$

Unfortunately, this equality is not always exact. Many interferometers include non-linear effects such as those known as "cyclic errors." The cyclic errors can be expressed as contributions to the phase and/or the intensity of the measured interference signal and have a sinusoidal dependence on the change in for example optical path length 2pnL. In particular, a first order cyclic error in phase has for the example a sinusoidal dependence on $(4\pi pnL)/\lambda$ and a second order cyclic error in phase has for the example a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. Nos. 6,137,574, 6,252,688, and 6,246,481 by Henry A. Hill.

There are in addition to the cyclic errors, non-cyclic non-linear errors (NCNLEs) or non-cyclic errors. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI). Another source of beam shearing is imperfections in components of the interferometer optics. A change in relative beam shear can also be introduced by a lateral displacement of a measurement object that includes a retroreflector. The relative difference in wavefronts can be a consequence of wavefront errors present in respective components of an input beam to the interferometer, i.e. a common mode type of wavefront error, and/or generated by imperfections in optical components of the interferometer, i.e. a differential mode type of wavefront error. Some interferometry systems include a detector positioned at some location remote from the interferometer. The output beam can be directed to the detector using an optical waveguide, such as a fiber optic pickup. Effects like beam shear can reduce coupling efficiency into the waveguide and/or can contribute sources of error into phase measurements by, e.g., coupling the different output beam components into different guided modes in the waveguide.

It is therefore generally desirable to reduce beam shear in interferometry systems used for high precision measurements as a reduction in beam shear can reduce certain errors made using the system.

SUMMARY

Apparatus and methods are disclosed that can reduce non-linear non-cyclic errors (NLNCE) in interferometry measurements due to shear of a measurement beam. NLNCE's may be reduced by reducing (e.g., eliminating) beam shear between the reference and measurement beam components in the interferometer output beam. This is achieved, in part, by providing an input beam having a reference beam component with a smaller cross-sectional dimension relative to the corresponding dimension of the measurement beam component. For example, the apparatus and methods can reduce the size of the reference beam component of an input beam to the interferometer relative to the size of the respective measurement beam component. The size reduction can be achieved by apodizing the beam (e.g., using an aperture stop), or by using an afocal system, for example, to demagnify the beam. Apodization typically reduces beam power while demagnification typically does not.

The reduction in size of the reference beam component may be different in the pitch and yaw planes to accommodate different magnitudes of changes of orientation in pitch and yaw of a plane mirror measurement object in a plane mirror interferometer. The optimum reduction in size in the two planes is related to the maximum values of pitch and yaw encountered in an end use application.

An aperture stop in the path of the output beam may also be used to reduce the size of the non-heterodyne or non-homodyne component of the electric interference signal subsequently generated by the detector without significantly reducing the size of the heterodyne or homodyne component. The stop may be for example circular, oblate, or square to achieve the best signal to noise ratio where the noise in this case is the NLNCE introduced by beam shear.

In general, in a first aspect, the invention features apparatus that include an input assembly positioned to receive a beam emitted from a light source including a first component beam and a second component beam, the first and second component beams having orthogonal polarization states, wherein the input assembly is configured to change a dimension of one of the component beams relative to the dimension of the other component beam and to direct both component beams to an interferometer.

Embodiments of the apparatus can include one or more of the following features. For example, the input assembly can be configured to direct both component beams to the interferometer along a common path. The input assembly can be configured to direct the first and second beam component beams along separate paths and recombine the component beams prior to directing them to the interferometer. The input assembly can include an afocal system positioned in a path of one of the separated component beams. The afocal system can be positioned in the path of the first component beam and reduces the dimension of the first component beam relative to the dimension of the second component beam. The afocal system can be positioned in the path of the second component beam and increases the dimension of the second component beam relative to the dimension of the first component beam. In some embodiments, the input assembly includes a first polarizing beam splitter positioned to direct the component beams along the separate paths. The input assembly can further include a second polarizing beam splitter positioned to direct the component beams along the common path.

The apparatus can further include the light source configured so that the component beams have different frequencies. The apparatus can also include the interferometer which is configured to direct the component beams along different paths and to produce an output beam by directing the component beams along a common path, wherein the output beam comprises information about an optical path difference between the different component beam paths. The path of one of the component beams can contact a measurement object. The apparatus can also include an output assembly positioned in the path of the output beam and configured to change a dimension of the component beam that contacts the measurement object. The output assembly can reduce the dimension of the component beam (e.g., by demagnifying or apodizing) that contacts the measurement object. For example, the output assembly can include an aperture stop having an aperture smaller than the dimension of the component beam that contacts the measurement object. The path of one of the component beams may not contact the measurement object and the dimension of that beam is about the same size or smaller than the aperture of the aperture stop. The output assembly can be positioned so that the path of the output beam is substantially coincident with the axis of the aperture stop.

In some embodiments, the apparatus can include a detector configured to monitor an intensity of the output beam. The apparatus can also include an optical fiber positioned to receive the output beam and configured to guide the output beam to the detector.

In certain embodiments, the apparatus includes a fiber optic pickup positioned to receive the output beam.

In general, in another aspect, the invention features interferometry systems that include an input assembly positioned to receive a beam emitted from a light source including a first component beam and a second component beam, the input assembly being configured to change a dimension of one of the component beams relative to the dimension of the other component beam, an interferometer positioned to receive the component beams propagating from the input assembly, the interferometer being configured to direct the component beams along different paths and to produce an output beam by directing the component beams along a common path, wherein the output beam includes information about an optical path difference between the different component beam paths, and an output assembly positioned in the path of the output beam and configured to change a dimension of the component beam that contacts the measurement object.

Embodiments of the interferometry systems can include one or more features of other aspects.

In a further aspect, the invention features lithography systems for use in fabricating integrated circuits on a wafer. The systems includes a stage for supporting the wafer, an illumination system for imaging spatially patterned radiation onto the wafer, a positioning system for adjusting the position of the stage relative to the imaged radiation, and an interferometry system including the foregoing apparatus or the foregoing interferometry system for monitoring the position of the wafer relative to the imaged radiation.

In a further aspect, the invention features lithography systems for use in fabricating integrated circuits on a wafer that include a stage for supporting the wafer and an illumination system including a radiation source, a mask, a positioning system, a lens assembly, and an interferometry system including the foregoing apparatus or the foregoing interferometry system, wherein during operation the source directs radiation through the mask to produce spatially patterned radiation, the positioning system adjusts the position of the mask relative to the radiation from the source, the lens assembly images the spatially patterned radiation onto the wafer, and the multi-axis interferometry system monitors the position of the mask relative to the radiation from the source.

In another aspect, the invention features beam writing systems for use in fabricating a lithography mask, the systems include a source providing a write beam to pattern a substrate, a stage supporting the substrate, a beam directing assembly for delivering the write beam to the substrate, a positioning system for positioning the stage and beam directing assembly relative one another, and an interferometry system comprising the foregoing apparatus or the foregoing interferometry system for monitoring the position of the stage relative to the beam directing assembly.

In a further aspect, the invention features lithography methods for use in fabricating integrated circuits on a wafer, where the methods include supporting the wafer on a moveable stage, imaging spatially patterned radiation onto the wafer, adjusting the position of the stage, and monitoring the position of the stage using an interferometry system including the foregoing apparatus or the foregoing interferometry.

In another aspect, the invention features lithography methods for use in the fabrication of integrated circuits that include directing input radiation through a mask to produce spatially patterned radiation, positioning the mask relative to the input radiation, monitoring the position of the mask relative to the input radiation using an interferometry system including the foregoing apparatus or the foregoing interferometry system, and imaging the spatially patterned radiation onto a wafer.

In another aspect, the invention features lithography methods for fabricating integrated circuits on a wafer that include positioning a first component of a lithography system relative to a second component of a lithography system to expose the wafer to spatially patterned radiation, and monitoring the position of the first component relative to the second component using an interferometry system including the foregoing apparatus or the foregoing interferometry system.

In a further aspect, the invention features methods for fabricating integrated circuits that include a foregoing lithography method.

In another aspect, the invention features methods for fabricating integrated circuits that include using a foregoing lithography system.

In another aspect, the invention features methods for fabricating a lithography mask, the method including directing a write beam to a substrate to pattern the substrate, positioning the substrate relative to the write beam, and monitoring the position of the substrate relative to the write beam using an interferometry system including the foregoing apparatus or the foregoing interferometry system.

Among other advantages, the methods and apparatus can provide highly accurate interferometric measurements. In particular, the methods and apparatus can reduce inaccuracies associated with beam shear in an interferometry system, such as inaccuracies associated with beam shear in systems that utilize a waveguide (e.g., a fiber optic) between the interferometer and detector.

The methods and apparatus can reduce errors associated with beam shear without substantially reducing the output beam intensity at the detector or the amplitude of the interference signal associated with the detected output beam. For example, while a portion of the measurement beam can be blocked from the detector by the output assembly, most or all of the intensity of the reference beam component is transmitted to the detector due to the reduction in beam size at the input assembly. Thus, the output beam intensity at the detector should be greater than the intensity of an output beam in a system in which both beam components were reduced in size at an output assembly.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
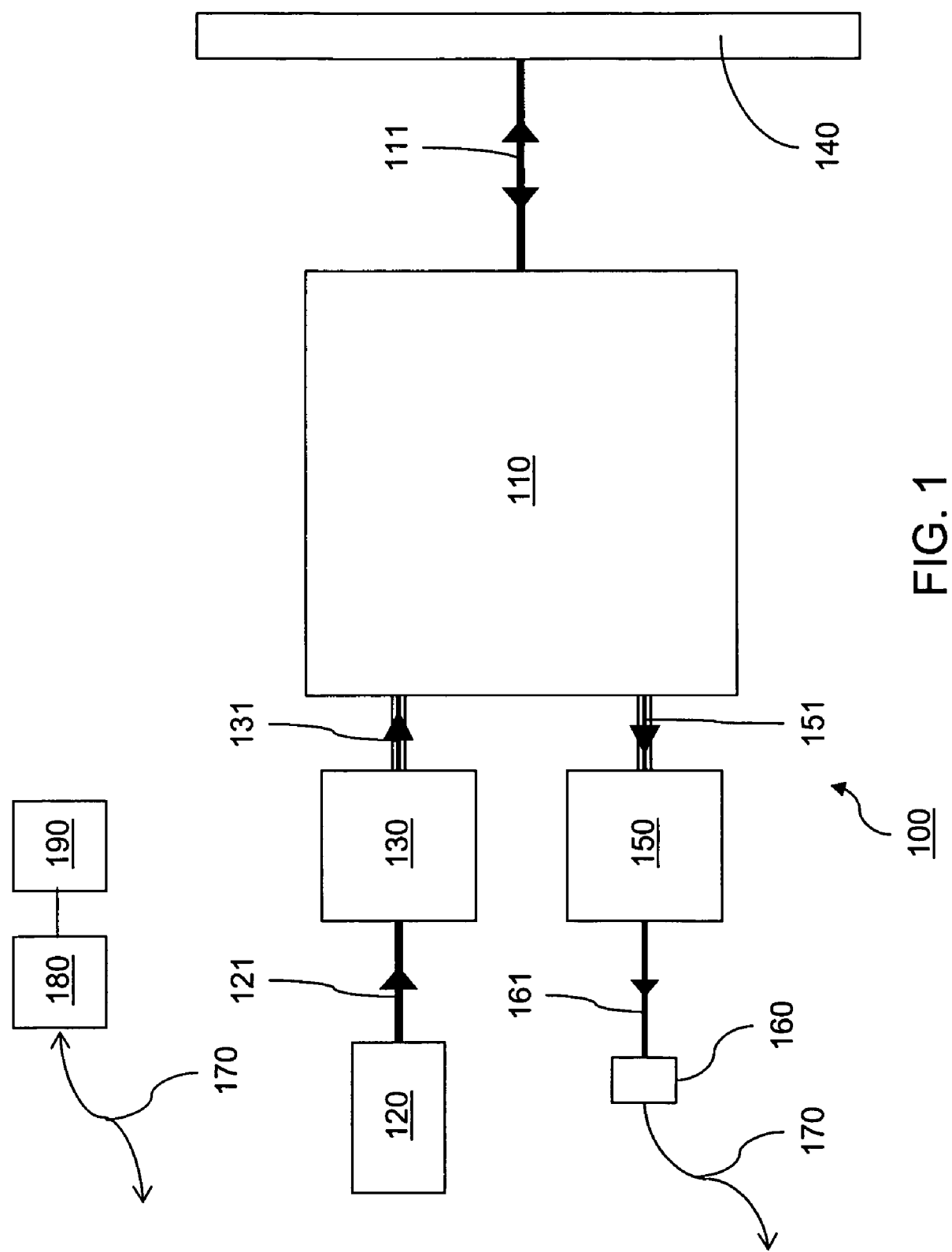
FIG. 1 is a schematic diagram of an interferometry system including an input assembly and an output assembly.

An interferometry system 100 that includes an input assembly 130 and an output assembly 150 is shown schematically in FIG. 1. System 100 also includes a light source 120 (e.g., a heterodyne or homodyne light source), an interferometer 110, and a fiber optic pickup including an optical fiber 170 and an input coupled 160. The optical fiber 170 guides optical signals launched into the fiber by input coupler 160 to a detector 180, which is in electrical communication with an electronic processor 190 (e.g., a PC or a custom electronics assembly). Interferometry system 100 is configured to monitor variations in the displacement and/or orientation of a measurement object 140 with respect to interferometer 110.

During operation of the interferometry system, light source 120 directs a beam to input assembly 130 along a path 121. Input assembly 130 reduces a dimension (e.g., a diameter) of a reference beam component of the beam, and directs the beam to interferometer 110 along path 131. Interferometer 110 splits the input beam into a measurement beam and a reference beam, and directs the measurement beam to reflect from measurement object 140. The path of the measurement beam between interferometer 110 and measurement object 140 is indicated by 111. Depending on the specific type of interferometer being used, the measurement beam can propagate between the interferometer and measurement object more than once, along the same or different paths each time.

Interferometer 110 combines the measurement and reference beams to form an output beam, which it directs towards output assembly 150 along path 151. Output assembly 150 reduces the size of the measurement beam component of the output beam, and directs the output beam towards fiber optic input coupler 160 along path 161. Fiber optic input coupler 160 couples the output beam into fiber optic 170, which guides the output beam to detector 180. Detector 180 monitors the intensity of the output beam and sends an electrical signal related to the beam intensity to electronic processor 190. Electronic processor monitors a phase of the output beam from the electrical signal, and determines information about the relative position of measurement object 140 and interferometer 110 from the monitored phase.

Figure 2:
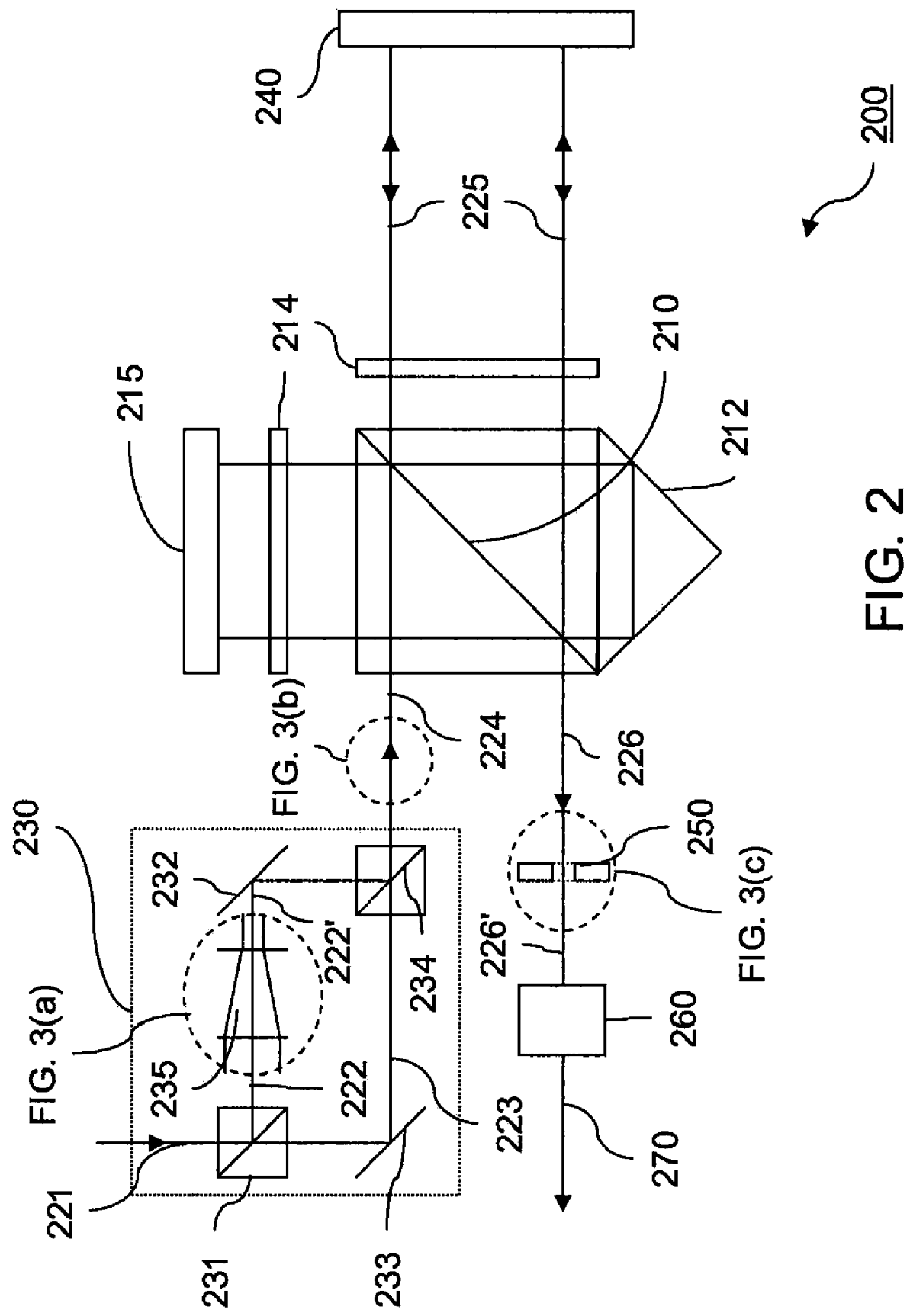
FIG. 2 is a diagram of a high stability plane mirror interferometer (HSPMI) used in conjunction with an input assembly and an output assembly.

An example of a specific interferometry system is system 200 shown in FIG. 2. The interferometer in system 200 is an HSPMI and includes a polarizing beam splitter 210, a retroreflector 212, a reference mirror 215, and quarter wave plates 214. System 200 also has an input assembly 230, which includes polarizing beam splitters 231 and 234, reflectors (e.g., mirrors) 232 and 233, and afocal system 235. The output assembly in system 200 is composed of an aperture stop 250, which is positioned between the interferometer and a fiber optic input coupler 260. Input coupler 260 is connected to a fiber optic 270.

Operation of system 200 is as follows. Beam splitter 231 receives an initial beam propagating along path 221. This beam splitter splits the initial beam into orthogonally polarized component beams and directs one of the component beams towards afocal system 235 along a path 222, and directs the other component beam to reflect from reflector 233 and towards polarizing beam splitter 234 along path 223.

Figure 3A:
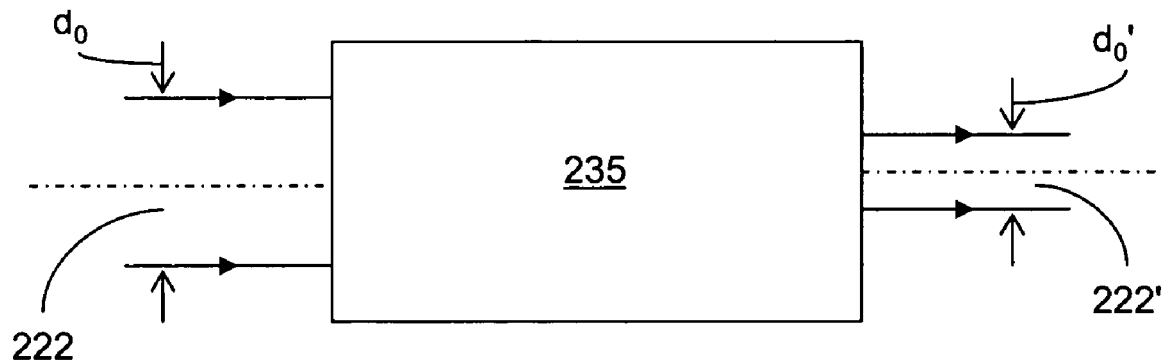
FIG. 3(a) is a schematic diagram illustrating the effect of an afocal system in an input assembly.

Referring also to FIG. 3(a), prior to passing through afocal system 235, reference component beam propagating along path 222 has a diameter $d_0$. This diameter is substantially the same as the diameter of the measurement component beam. The reference component beam exiting afocal system 235 along path 222' has a diameter $d_0'$, where $d_0'<d_0$. The ratio of $d_0'/d_0$ can vary, and in some embodiments can be about 0.5 or less (e.g., about 0.4 or less, about 0.3 or less, about 0.2 or less, about 0.1 or less). The ratio $d_0'/d_0$ can selected based on an expected amount of beam shear in the system's end use application. For example, the larger the expected amount of beam shear, the smaller the ratio can be made.

Figure 3B:
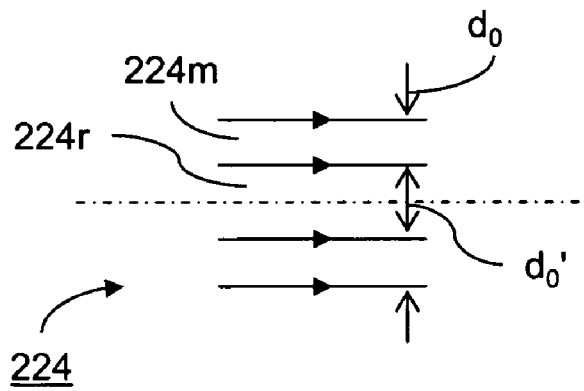
FIG. 3(b) is a diagram showing an input beam with a reduced reference beam component.

Referring again to FIG. 2, propagating along path 222', the reduced diameter component beam reflects from reflector 232 and propagates to polarizing beam splitter 234. Referring additionally to FIG. 3(b), overlapping component beams 224m and 224r, corresponding to the measurement component beam and reference component beams, respectively, propagate to the interferometer along a common path 224.

The overlapping component beams form an input beam for the interferometer. Upon entering the interferometer, the component beam with the reduced dimension is reflected by polarizing beam splitter 210, while the other component beam is transmitted. Thus, in the present embodiment, the reduced diameter component beam becomes the interferometer reference beam, while the other component beam becomes the interferometer measurement beam.

The reference beam reflects from reference mirror 215, is transmitted by PBS 210, reflects from retroreflector 212, returns to reference mirror 215, and is reflected by PBS 210 out of the interferometer along path 226. Note that the double pass through quarter wave plate 214 on each trip to reference mirror 215 transforms the polarization state of the reference beam to an orthogonal state, allowing the interferometer's PBS to first reflect, then transmit, then again reflect the reference beam.

The measurement beam, initially transmitted by PBS 210, exits the interferometer along one of the paths 225, reflects from measurement object 240, and returns to the interferometer along substantially the same path (the exact path depends, for example, on the orientation of the measurement object with respect to the interferometer). Due to the double pass through quarter wave plate 214, the measurement beam is now reflected by PBS 210, reflects from retroreflector 212, and again reflects from PBS 210, exiting the interferometer propagating towards measurement object 240 along the other path labeled 225. The second pass measurement beam reflects from measurement object 240 and returns to the interferometer, this time being transmitted by PBS 210 and exiting the interferometer, ideally along path 226 as well. Due to beam shearing, however, the path of the measurement beam exiting the interferometer may deviate from path 226.

Figure 3C:
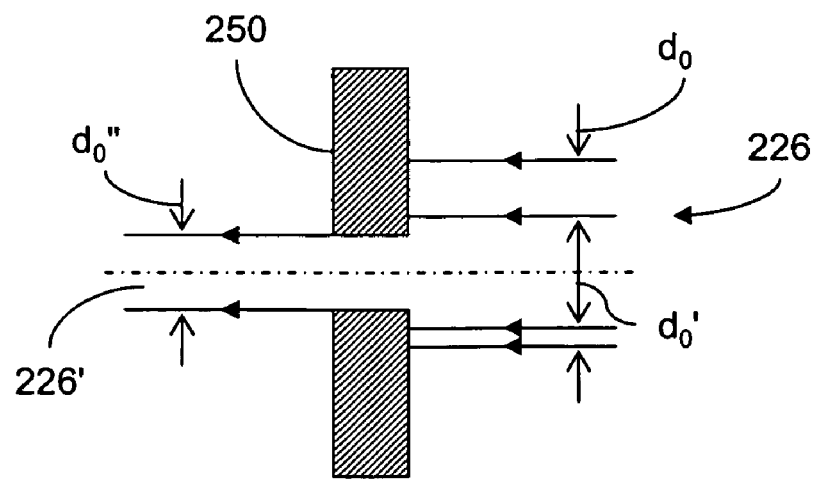
FIG. 3(c) is a diagram showing an output beam at an aperture stop.

Referring to FIG. 3(c), prior to passing through aperture stop 250, the measurement and reference beam components have diameters $d_0$ and $d_0'$, respectively. The aperture stop includes a circular aperture and reduces the diameter of both beam components to $d_0''$, which can be the same or different as $d_0'$.

Referring again to FIG. 2, upon transmission by aperture stop 250, the overlapping measurement and reference beam components, forming the interferometer output beam, propagate to input coupler 260 along path 226'. Input coupler 260 typically includes one or more focusing elements (e.g., one or more lenses) and a mechanical mounting fixture that positions an end of fiber optic 270 relative to the focusing element(s) so that input coupler 260 couples the output beam into the fiber optic, which guides the output beam to a remote detector (not shown).

The operation of system 200 can be illustrated by considering the following example. Consider an implementation where the input beam has a square cross-section and substantially constant intensity across the beam for both the reference and measurement beam components. Let w be the width of the beam and s be the maximum value of the shear of the measurement beam in a particular plane (e.g., the x-direction) at a detector or FOP input in the output beam path, where s<w/2. When the reduced width, $w_R$, of the reference beam in a corresponding x-direction following the afocal attachment of the input assembly is $$0 < w_R \leq w - 2s, \quad (3)$$

any NLNCE introduced due to the beam shear will be reduced (e.g., eliminated). Also the amplitude of the electrical interference signal can be independent of the shear of the measurement beam. The corresponding relative amplitude $A_{rel}$ of the electrical interference signal may be given by $$A_{rel} = \left(\frac{w_R}{w}\right)^{1/2}. \quad (4)$$

Thus, an aperture stop may be placed at the FOP with a width in the x-direction equal to $w_R$ without reducing the amplitude of the electrical interference signal.

Figure 4A:
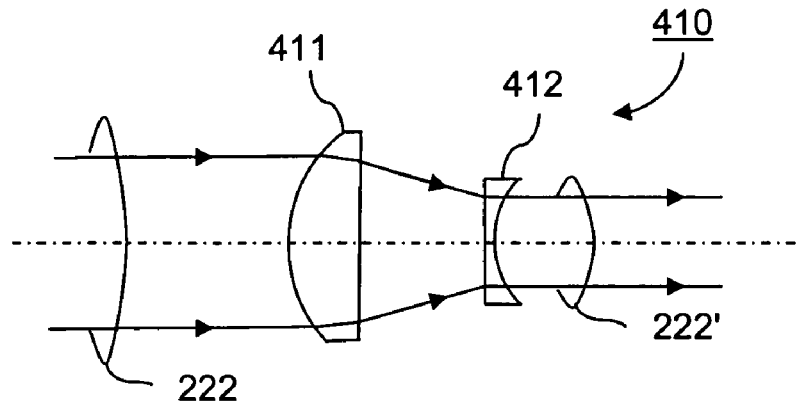
FIG. 4(a) is a diagrammatic elevational view of an afocal system comprising a Galilean afocal lens.

Turning now to specific configurations of afocal systems that can be used in input assembly 230, in general, afocal systems can include afocal lenses and/or anamorphic afocal attachments (see, e.g., Chapter 2 entitled "Afocal Systems" by W. B. Wetherell in *Handbook Of Optics II*, Second Edition (McGraw-Hill)). An embodiment of an afocal system is shown diagrammatically in FIG. 4(a). Afocal system 410 shown in FIG. 4(a) is known as a Galilean afocal lens. Galilean afocal lens 410 includes positive and negative lenses 411 and 412, respectively. Alternatively, a Keplerian afocal lens can be used.

Figure 4B:
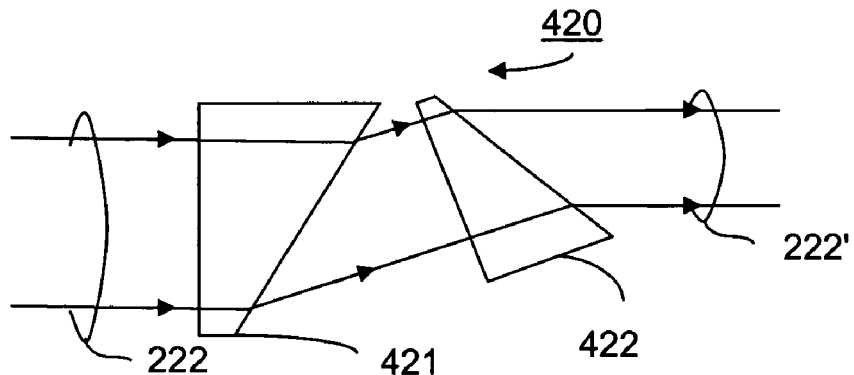
FIG. 4(b) is a diagrammatic elevational view of an afocal system comprising a prismatic anamorphic afocal attachment.

Anamorphic afocal attachments may be based on cylindrical lenses, prisms, and/or birefringent elements. An example of a prismatic anamorphic afocal attachment is shown diagrammatically in FIG. 4(b). Prismatic anamorphic afocal system 420 shown includes two prisms 421 and 422. Afocal system reduces the beam dimension in the plane of FIG. 4(b), but not in the plane orthogonal to the figure.

Figure 4C:
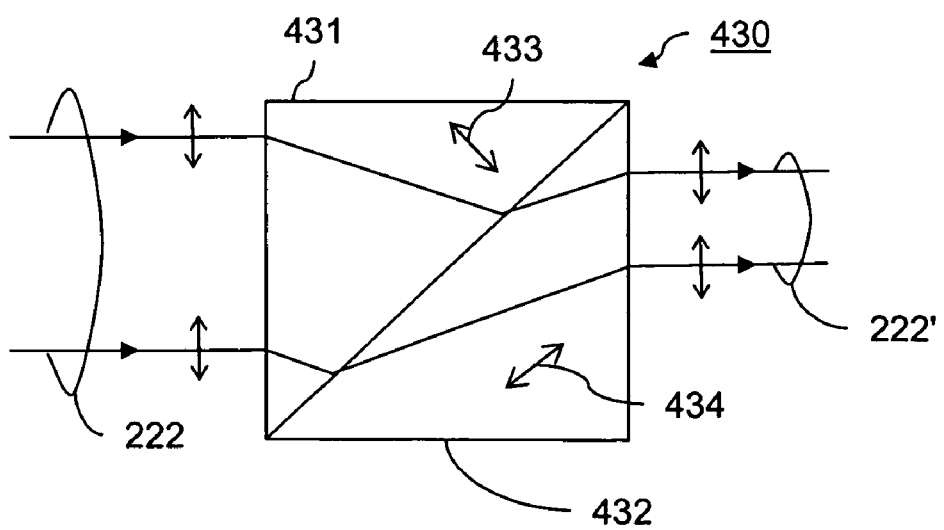
FIG. 4(c) is a diagrammatic elevational view of an afocal system comprising a birefringent anamorphic afocal attachment.

An example of a birefringent anamorphic afocal system shown in FIG. 4(c). Anamorphic afocal system 430 includes two birefringent prisms 431 and 432 bonded together. FIG. 4(c) illustrates the operation of the birefringent anamorphic afocal system in a demagnifying mode (i.e., the beam exiting the system propagating from left to right is demagnified relative to the beam that enters the system). The birefringent prisms may include, for example, uniaxial crystals such as calcite and paratellurite. The optic axes for birefringent prisms 431 and 432 are shown in FIG. 4(c) as elements 433 and 434, respectively. Polarization of the input beam is extraordinary. The path of the input beam through the birefringent anamorphic afocal system and the directions for the optic axes 433 and 434 are shown for a system including positive uniaxial crystals wherein the ordinary index of refraction is less than the extraordinary index of refraction.

Although the foregoing embodiments operate by reducing the size of the reference beam component of the input beam, alternatively or additionally, other systems can operate by enlarging the measurement beam component of the input beam relative to the reference beam component. For example, in some embodiments, the input assembly can include an afocal system in the path of the measurement beam component configured to enlarge the dimension (e.g., the diameter) of the measurement beam component.

Moreover, in system 200, the afocal system reduces the beam diameter symmetrically about the beams propagation axis. However, in general, the reduction in beam dimension may be different in along different cross-sectional directions of the beam. In some embodiments, the beam diameter can be reduced by different amounts in directions corresponding to the pitch and yaw planes of the measurement object. For example, in certain applications, the pitch and yaw planes may accommodate different magnitudes of changes of orientation of the measurement object. The optimum reduction in size in the two planes can be related to the maximum values of pitch and yaw encountered in the end use application, so it may be desirable to reduce the beam diameter by different amounts in these directions.

Furthermore, while the aperture of aperture stop 250 is circular, in general aperture stops can also have apertures with other shapes. For example, systems can include aperture stops that are elliptical, square, rectangular, or some other polygonal shape. In embodiments where the reference beam dimension is reduced by different amounts along different directions, for example, it may be desirable for the aperture stop to reduce the dimensions of the output beam by corresponding amounts along the different directions.

In general, while system 200 includes an HSPMI, input and/or output assemblies can be used with other types of interferometers as well. Examples of other forms of interferometers that may utilize the techniques disclosed herein include both single and multiple pass interferometers (the HSPMI is a double pass interferometer), and include passive interferometers, dynamic interferometers, and dispersion interferometers. Alternatively, or additionally, the techniques can be applied to interferometers that monitor more than one degree of freedom, interferometers that monitor variations in angular orientation of a measurement object, and angular displacement interferometers that measure beam propagation direction.

Examples of dynamic interferometers are described in U.S. patent application Ser. No. 10/226,591 filed Aug. 23, 2002 and entitled "DYNAMIC INTERFEROMETER CONTROLLING DIRECTION OF INPUT BEAM" by Henry A. Hill. Examples of passive zero shear interferometers are described in U.S. patent application Ser. No. 10/207,314, entitled "PASSIVE ZERO SHEAR INTERFEROMETERS," filed Jul. 29, 2002, by Henry A. Hill. Examples of angular displacement interferometers are described in: U.S. patent application Ser. No. 10/226,591 entitled "DYNAMIC INTERFEROMETER CONTROLLING DIRECTION OF INPUT BEAM," filed Aug. 23, 2002; U.S. Provisional Application 60/314,345 filed Aug. 22, 2001 and entitled "PASSIVE ZERO SHEAR INTERFEROMETERS USING ANGLE SENSITIVE BEAM-SPLITTERS," both by Henry A. Hill, and U.S. patent application Ser. No. 10/272,034 entitled "INTERFEROMETERS FOR MEASURING CHANGES IN OPTICAL BEAM DIRECTION" and filed Oct. 15, 2002 by Henry A. Hill and Justin Kreuzer. Alternatively, or additionally, interferometry systems may include one or more differential angular displacement interferometers, examples of which are also described in U.S. patent application Ser. No. 10/272,034. Examples of interferometry systems for measuring more than one degree of freedom and for reducing beam shear are described in U.S. patent application Ser. No. 10/352,616 filed Jan. 28, 2003 and entitled "MULTIPLE-PASS INTERFEROMETRY" by Henry A. Hill. Other forms of multiple pass interferometers are described in an article entitled "Differential interferometer arrangements for distance and angle measurements: Principles, advantages and applications" by C. Zanoni, VDI Berichte Nr. 749, 93-106 (1989). Examples of two-wavelength dispersion interferometers are described in U.S. Pat. No. 6,219,144 B1 entitled "APPARATUS AND METHOD FOR MEASURING THE REFRACTIVE INDEX AND OPTICAL PATH LENGTH EFFECTS OF AIR USING MULTIPLE-PASS INTERFEROMETRY" by Henry A. Hill, Peter de Groot, and Frank C. Demarest and U.S. Pat. No. 6,327,039 B1 by Peter de Groot, Henry A. Hill, and Frank C. Demarest.

In certain applications, the techniques described herein can be used in dispersion measuring systems. In dispersion measuring systems, effects of non-cyclic non-linear errors may be amplified by one or more orders of magnitude compared to conventional interferometry applications (e.g., displacement measuring interferometry). In a dispersion measuring application, optical path length measurements are made at multiple wavelengths, e.g., 532 nm and 1064 nm, and are used to measure dispersion of a gas in the measurement path of the distance measuring interferometer. The dispersion measurement can be used to convert the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

In addition to the extrinsic dispersion measurement, the conversion of the optical path length to a physical length requires knowledge of an intrinsic value of the gas. The factor Γ is a suitable intrinsic value and is the reciprocal dispersive power of the gas for the wavelengths used in the dispersion interferometry. Values for Γ range for example from approximately 20 to 100 depending on the wavelengths used in the dispersion measurements. The effects of non-cyclic non-linear errors in the extrinsic dispersion measurement are multiplied by the factor of Γ in the conversion of the optical path length to a physical length.

The factor Γ can be measured separately or based on literature values. Non-cyclic non-linearities in the interferometer also contribute to measurements of the factor Γ. In addition, non-cyclic non-linearities can degrade interferometric measurements used to measure and/or monitor the wavelength of a beam.

The interferometry systems described herein provide highly accurate measurements. Such systems can be especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 5:
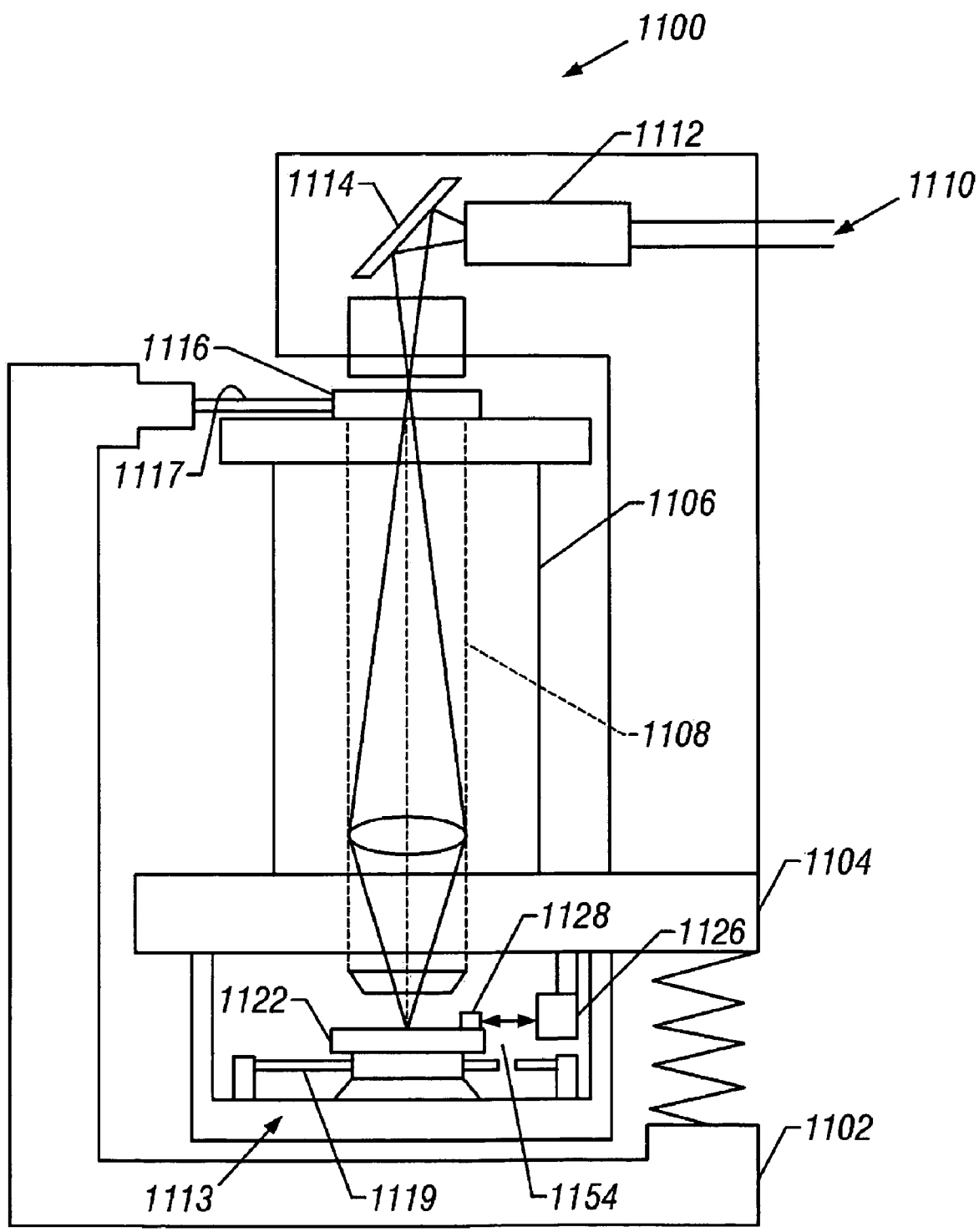
FIG. 5 is a schematic diagram of an embodiment of a lithography tool that includes an interferometer.

An example of a lithography scanner 1100 using an interferometry system 1126 is shown in FIG. 5. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see *supra* Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 6A:
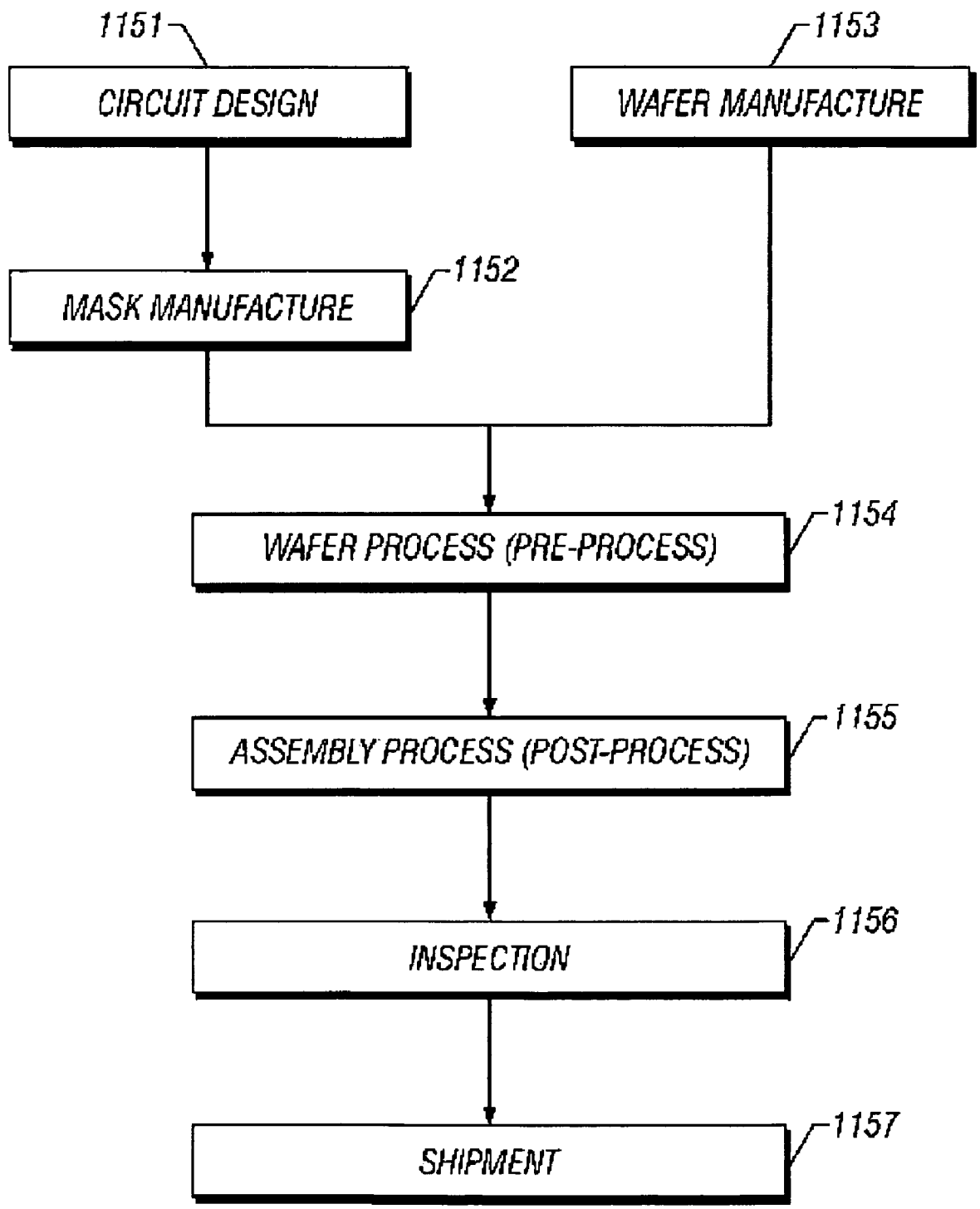
FIG. 6(a) and FIG. 6(b) are flow charts that describe steps for making integrated circuits.

As is well known in the art, lithography is a critical part of manufacturing methods for making semiconducting devices. For example, U.S. Patent 5,483,343 outlines steps for such manufacturing methods. These steps are described below with reference to FIGS. 6a and 6b. FIG. 6a is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 6B:
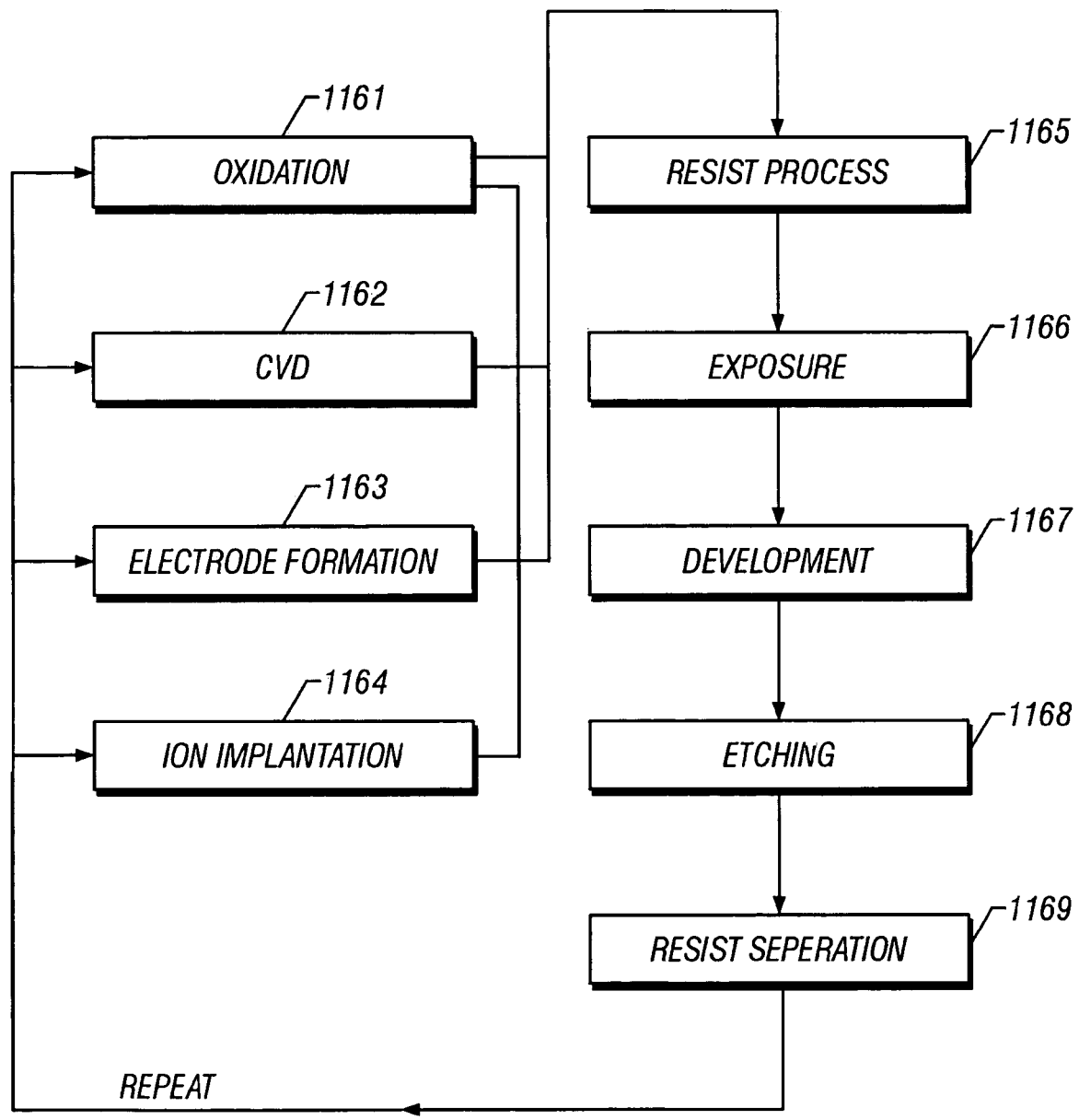

FIG. 6b is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 7:
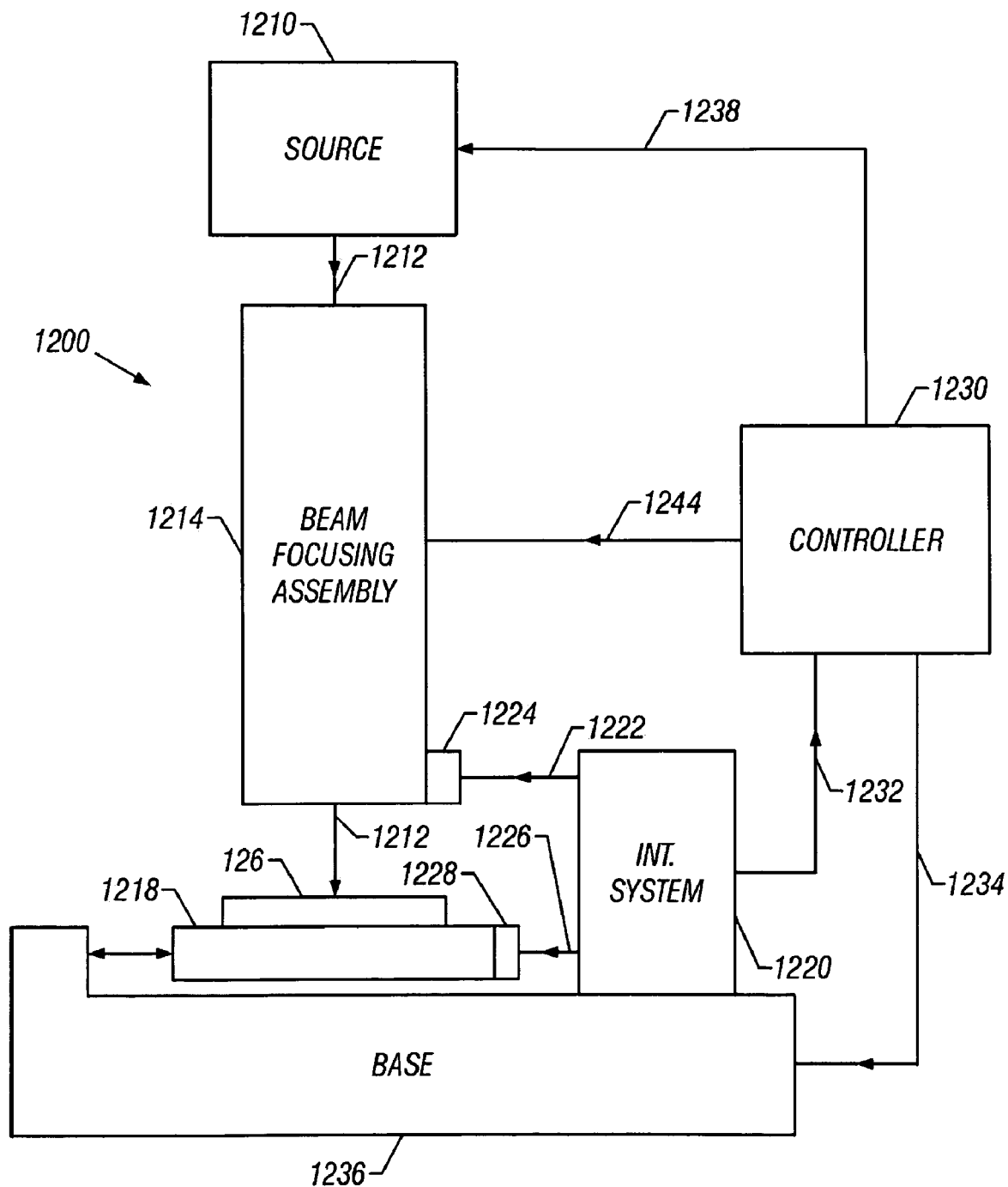
FIG. 7 is a schematic of a beam writing system that includes an interferometry system.

As an example, a schematic of a beam writing system 1200 is shown in FIG. 7 A source 1210 generates a write beam 1212, and a beam focusing assembly 1214 directs the radiation beam to a substrate 126 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 126. Interferometry system 1220 sends a measurement signal 1232 to controller 1230 that is indicative of the relative position of write beam 1212 on substrate 126. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller.

In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention.

What is claimed is:

1. An apparatus, comprising:
   an input assembly positioned to receive a beam emitted from a light source comprising a first component beam and a second component beam, the first and second component beams having orthogonal polarization states,
   wherein the input assembly is configured to change a dimension of the first component beam relative to the dimension of the second component beam so that the second component beam has a smaller cross-sectional dimension than the first component beam; and
   an interferometer positioned to receive the first and second component beams from the input assembly, the interferometer being configured to direct the first and second component beams along separate paths, where the first component beam contacts a measurement object, and to recombine the first and second component beams to provide an output beam that comprises information about an optical path difference between the different paths.

2. The apparatus of claim 1, wherein the input assembly is configured to direct both component beams to the interferometer along a common path.

3. The apparatus of claim 1, wherein the input assembly is configured to direct the first and second beam component beams along separate paths and recombine the component beams prior to directing them to the interferometer.

4. The apparatus of claim 3, wherein the input assembly comprises an afocal system positioned in a path of one of the separated component beams.

5. The apparatus of claim 4, wherein the afocal system is positioned in the path of the first component beam and reduces the dimension of the first component beam relative to the dimension of the second component beam.

6. The apparatus of claim 4, wherein the afocal system is positioned in the path of the second component beam and increases the dimension of the second component beam relative to the dimension of the first component beam.

7. The apparatus of claim 3, wherein the input assembly comprises a first polarizing beam splitter positioned to direct the component beams along the separate paths.

8. The apparatus of claim 7, wherein the input assembly further comprises a second polarizing beam splitter positioned to direct the component beams along the common path.

9. The apparatus of claim 1, further comprising the light source configured so that the component beams have different frequencies.

10. The apparatus of claim 1, further comprising an output assembly positioned in the path of the output beam and configured to change a dimension of the first component beam.

11. The apparatus of claim 10, wherein the output assembly reduces the dimension of the first component beam.

12. The apparatus of claim 11, wherein the output assembly comprises an aperture stop having an aperture smaller than the dimension of the first component beam.

13. The apparatus of claim 12, wherein the path of the second component beam does not contact the measurement object and the dimension of that beam is about the same size or smaller than the aperture of the aperture stop.

14. The apparatus of claim 13, wherein the output assembly is positioned so that the path of the output beam is substantially coincident with the axis of the aperture stop.

15. The apparatus of claim 1, further comprising a detector configured to monitor an intensity of the output beam.

16. The apparatus of claim 15, further comprising an optical fiber positioned to receive the output beam and configured to guide the output beam to the detector.

17. The apparatus of claim 9, further comprising a fiber optic pickup positioned to receive the output beam.

18. A lithography system for use in fabricating integrated circuits on a wafer, the system comprising:
    a stage for supporting the wafer;
    an illumination system for imaging spatially patterned radiation onto the wafer;
    a positioning system for adjusting the position of the stage relative to the imaged radiation; and
    an interferometry system comprising the apparatus of claim 1 for monitoring the position of the wafer relative to the imaged radiation.

19. A lithography system for use in fabricating integrated circuits on a wafer, the system comprising:
    a stage for supporting the wafer; and
    an illumination system including a radiation source, a mask, a positioning system, a lens assembly, and an interferometry system comprising the apparatus of claim 1,
    wherein during operation the source directs radiation through the mask to produce spatially patterned radiation, the positioning system adjusts the position of the mask relative to the radiation from the source, the lens assembly images the spatially patterned radiation onto the wafer, and the multi-axis interferometry system monitors the position of the mask relative to the radiation from the source.

20. A beam writing system for use in fabricating a lithography mask, the system comprising:
    a source providing a write beam to pattern a substrate;
    a stage supporting the substrate;
    a beam directing assembly for delivering the write beam to the substrate;
    a positioning system for positioning the stage and beam directing assembly relative one another; and
    an interferometry system comprising the apparatus of claim 1 for monitoring the position of the stage relative to the beam directing assembly.

21. A lithography method for use in fabricating integrated circuits on a wafer, the method comprising:

supporting the wafer on a moveable stage;
imaging spatially patterned radiation onto the wafer;
adjusting the position of the stage; and
monitoring the position of the stage using an interferometry system comprising the apparatus of claim 1.

22. A lithography method for use in the fabrication of integrated circuits comprising:
    directing input radiation through a mask to produce spatially patterned radiation;
    positioning the mask relative to the input radiation;
    monitoring the position of the mask relative to the input radiation using an interferometry system comprising the apparatus of claim 1; and
    imaging the spatially patterned radiation onto a wafer.

23. A lithography method for fabricating integrated circuits on a wafer comprising:
    positioning a first component of a lithography system relative to a second component of a lithography system to expose the wafer to spatially patterned radiation; and
    monitoring the position of the first component relative to the second component using an interferometry system comprising the apparatus of claim 1.

24. A method for fabricating a lithography mask, the method comprising:
    directing a write beam to a substrate to pattern the substrate;
    positioning the substrate relative to the write beam; and
    monitoring the position of the substrate relative to the write beam using an interferometry system comprising the apparatus of claim 1.

* * * * *

UNITED STATES PATENT AND TRADEMARK OFFICE
CERTIFICATE OF CORRECTION

PATENT NO. : 7,495,770 B2 Page 1 of 1
APPLICATION NO. : 11/500562
DATED : February 24, 2009
INVENTOR(S) : Henry A. Hill It is certified that error appears in the above-identified patent and that said Letters Patent is hereby corrected as shown below:

Column 16, line 31, in claim 18, delete "wafer,the" and insert -- wafer, the --.

Column 16, line 41, in claim 18, delete "wafer,the" and insert -- wafer, the --.

Column 16, line 67, in claim 21, delete "wafer,the" and insert -- wafer, the --.

Signed and Sealed this

Twelfth Day of May, 2009

JOHN DOLL
*Acting Director of the United States Patent and Trademark Office*